US012663666B2

(12) United States Patent
Whitbread et al.

(10) Patent No.: US 12,663,666 B2
(45) Date of Patent: Jun. 23, 2026

(54) SEMICONDUCTOR-BASED MODULATOR INCLUDING A CONDUCTIVE STRAP

(71) Applicant: Lumentum Technology (UK) Limited, Northamptonshire (GB)

(72) Inventors: Neil David Whitbread, Northamptonshire (GB); Stephen Jones, Northamptonshire (GB); Robert Griffin, Northamptonshire (GB); John M. Heaton, Worcestershire (GB); Yuting Shi, Northamptonshire (GB)

(73) Assignee: Lumentum Technology UK Limited, Northamptonshire (GB)

( * ) Notice: Subject to any disclaimer, the term of this patent is extended or adjusted under 35 U.S.C. 154(b) by 261 days.

(21) Appl. No.: 18/478,665

(22) Filed: Sep. 29, 2023

(65) Prior Publication Data

US 2025/0004309 A1     Jan. 2, 2025

Related U.S. Application Data

(60) Provisional application No. 63/510,768, filed on Jun. 28, 2023.

(51) Int. Cl.
| | |
|---|---|
| *G02F 1/025* | (2006.01) |
| *G02F 1/01* | (2006.01) |
| *H10F 77/00* | (2025.01) |

(52) U.S. Cl.
CPC ............ *G02F 1/025* (2013.01); *G02F 1/0121* (2013.01); *H10F 77/933* (2025.01)

(58) Field of Classification Search
CPC ...................................................... G02F 1/025
See application file for complete search history.

(56) References Cited

U.S. PATENT DOCUMENTS

| | | | | |
|---|---|---|---|---|
| 5,076,655 | A * | 12/1991 | Bridges ................ | H01Q 13/206 |
| | | | | 385/132 |
| 2014/0355926 | A1* | 12/2014 | Velthaus ................... | G02F 1/25 |
| | | | | 385/3 |
| 2018/0046057 | A1* | 2/2018 | Yu .......................... | G02F 1/2257 |
| 2024/0377695 | A1* | 11/2024 | Aimone ................. | G02F 1/212 |
| 2025/0004309 | A1* | 1/2025 | Whitbread ............ | G02F 1/2257 |
| 2025/0035967 | A1* | 1/2025 | Sato ......................... | G02F 1/035 |
| 2025/0226352 | A1* | 7/2025 | Lao .......................... | H01L 24/85 |

* cited by examiner

*Primary Examiner* — Rhonda S Peace
(74) *Attorney, Agent, or Firm* — Harrity & Harrity, LLP

(57) ABSTRACT

An electro-optic modulator may include a radio frequency (RF) modulation region including a first optical waveguide, a second optical waveguide, a first set of electrode segments, a second set of electrode segments, and a conductive strap. The first optical waveguide may propagate a first optical signal. The second optical waveguide may propagate a second optical signal. The first set of electrode segments may apply a first RF signal to the first optical waveguide. The second set of electrode segments may apply a second RF signal to the second optical waveguide. The conductive strap may enable photocurrent generated in the first optical waveguide and the second optical waveguide and flowing through a doped layer below the first optical waveguide and the second optical waveguide to be extracted from the electro-optic modulator. The conductive strap may be ohmically contacted with the doped layer.

20 Claims, 4 Drawing Sheets

100

SEMICONDUCTOR-BASED MODULATOR INCLUDING A CONDUCTIVE STRAP

CROSS-REFERENCE TO RELATED APPLICATION

This Patent Application claims priority to U.S. Provisional Patent Application No. 63/510,768, filed on Jun. 28, 2023, and entitled "SEMICONDUCTOR-BASED MODULATOR INCLUDING A CONDUCTIVE ELEMENT." The disclosure of the prior Application is considered part of and is incorporated by reference into this Patent Application.

TECHNICAL FIELD

The present disclosure relates generally to a semiconductor-based modulator and to a semiconductor-based modulator including a conductive strap.

BACKGROUND

An electro-optic modulator is a device that applies an electrical signal, such as a radio frequency (RF) signal, to an optical signal to generate a modulated optical signal (e.g., an optical signal modulated to carry data represented by the electrical signal). An electro-optic modulator may comprise a travelling wave electrode structure positioned in close proximity to an optical waveguide. In operation, an electric field generated by the electrode structure overlaps the optical waveguide within a modulation region (e.g., over a predetermined distance) and causes electromagnetic interaction to generate a modulated optical signal. For example, an electro-optic modulator may take the form of a Mach-Zehnder (MZ) interferometer that includes an RF waveguide including two tracks, where each track is electrically connected to a set of RF electrode segments, with each set of RF electrode segments being arranged over one of two optical waveguides. Here, an RF signal applied by the sets of RF electrodes over the optical waveguides serves to modulate optical signals propagating in the optical waveguides.

SUMMARY

In some implementations, an electro-optic modulator includes an RF modulation region, including: a first optical waveguide to propagate a first optical signal travelling in a direction of propagation; a second optical waveguide to propagate a second optical signal travelling in the direction of propagation; a first set of electrode segments to apply a first RF signal to the first optical waveguide in association with modulating the first optical signal, the first RF signal being provided by a first track of an RF waveguide and travelling in the direction of propagation; a second set of electrode segments to apply a second RF signal to the second optical waveguide in association with modulating the second optical signal, the second RF signal being provided by a second track of the RF waveguide and travelling in the direction of propagation; and a conductive strap to enable photocurrent generated in the first optical waveguide and the second optical waveguide and flowing through a doped layer below the first optical waveguide and the second optical waveguide to be extracted from the electro-optic modulator, the conductive strap being between the first optical waveguide and the second optical waveguide and being ohmically contacted with the doped layer.

In some implementations, an electro-optic modulator includes a substrate; a first doped layer over the substrate; an undoped layer over the first doped layer; a second layer over the undoped layer, wherein a first region of the first doped layer, a first region of the undoped layer, a first region of the second layer, and first portions of a dielectric layer form a first rib structure, and wherein a second region of the first doped layer, a second region of the undoped layer, a second region of the second layer, and second portions of the dielectric layer form a second rib structure; a first set of electrode segments over the first rib structure; a second set of electrode segments over the second rib structure; a first track of an RF waveguide electrically connected to the first set of electrode segments; a second track of the RF waveguide electrically connected to the second set of electrode segments; and a conductive strap ohmically contacted with a third region of the first doped layer, the third region of the first doped layer being between the first region of the first doped layer and the second region of the first doped layer.

In some implementations, a semiconductor-based modulator includes an RF modulation region, including: a first optical waveguide to propagate a first optical signal travelling in a direction of propagation; a second optical waveguide to propagate a second optical signal travelling in the direction of propagation; an RF waveguide to apply a first RF signal to the first optical waveguide and to apply a second RF signal to the second optical waveguide, the first RF signal and the second RF signal travelling in the direction of propagation; and a conductive strap to reduce resistance on a conductive path between an external bias connection of the semiconductor-based modulator and a doped region below the first optical waveguide and the second optical waveguide to enable photocurrent flowing through the doped region to be extracted from the semiconductor-based modulator.

DETAILED DESCRIPTION

Figure 1A:
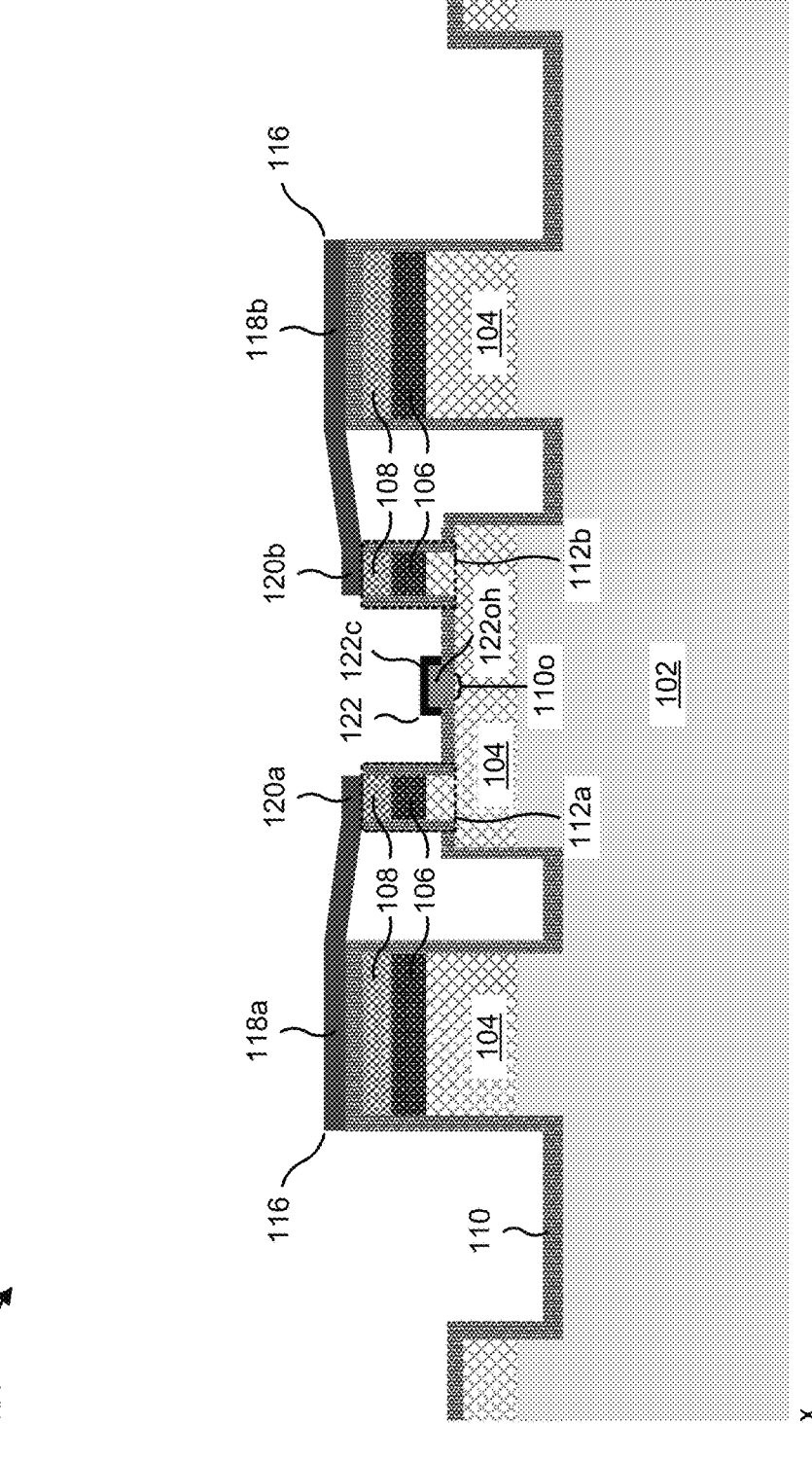
FIGS. 1A-1B are diagrams of an example implementation of a semiconductor-based modulator including a conductive strap.

The following detailed description of example implementations refers to the accompanying drawings. The same reference numbers in different drawings may identify the same or similar elements.

A semiconductor-based electro-optic modulator, such as an indium phosphide (InP)-based MZ modulator is direct-current (DC)-biased during operation. During operation, some light is absorbed in optical waveguides of the semiconductor-based electro-optic modulator. This absorption generates photocurrent. In a conventional semiconductor-based electro-optic modulator, longitudinal sheet resistance in a doped layer between optical waveguides is significant and, therefore, photocurrent induced in each modulation segment induces a voltage drop across this resistance. This voltage drop reduces the bias applied to parts of a modulation region of the semiconductor-based electro-optic modulator. The magnitude of the bias reduction increases as a distance from a bias electrode increases, with larger bias reductions being seen further from a bias electrode. This bias reduction reduces electro-optic efficiency in affected portions of the semiconductor-based electro-optic modulator, which leads to an increase in switching voltage. In particular, because the amount of photocurrent generated is dependent on an optical power, the increase in the switching voltage depends on an optical input power and, therefore, a current applied to a pre-modulator semiconductor optical amplifier (SOA) (e.g., an SOA that is upstream of the semiconductor-based electro-optic modulator). The dependence of the switching voltage on the pre-modulator SOA current increases setup complexity. For example, an increase in the pre-modulator SOA current would necessitate an increase in the bias voltage (e.g., to account for the increased switching voltage) and, therefore, different configurations would be needed for different pre-modulator SOA current levels.

Some implementations described herein provide a semiconductor-based electro-optic modulator including a conductive strap. In some implementations, the semiconductor-based electro-optic modulator includes a first optical waveguide to propagate a first optical signal travelling in a direction of propagation, and a second optical waveguide to propagate a second optical signal travelling in the direction of propagation. The semiconductor-based electro-optic modulator further includes a first set of electrode segments to apply a first RF signal to the first optical waveguide, with the first RF signal being provided by a first track of an RF waveguide and travelling in the direction of propagation, and includes a second set of electrode segments to apply a second RF signal to the second optical waveguide, with the second RF signal being provided by a second track of the RF waveguide and travelling in the direction of propagation. The semiconductor-based electro-optic modulator further includes a conductive strap between the first optical waveguide and the second optical waveguide. The conductive strap is ohmically contacted with a doped layer below the first optical waveguide and the second optical waveguide. The conductive strap enables photocurrent generated in the first optical waveguide and the second optical waveguide and flowing through the doped layer to be extracted from the electro-optic modulator. In some implementations, the conductive strap reduces longitudinal resistance and, therefore, reduces or eliminates a de-bias effect such that a modulation region of the semiconductor-based electro-optic modulator is subject to substantially the same bias conditions, irrespective of photocurrent levels. As a result, a switching voltage of the semiconductor-based electro-optic modulator is reduced (e.g., at a given pre-modulator SOA current level) and, furthermore, dependence of the switching voltage on optical power is reduced or eliminated. In this way, electro-optic efficiency is improved while setup complexity is reduced. Additional details are provided below.

Figure 1B:
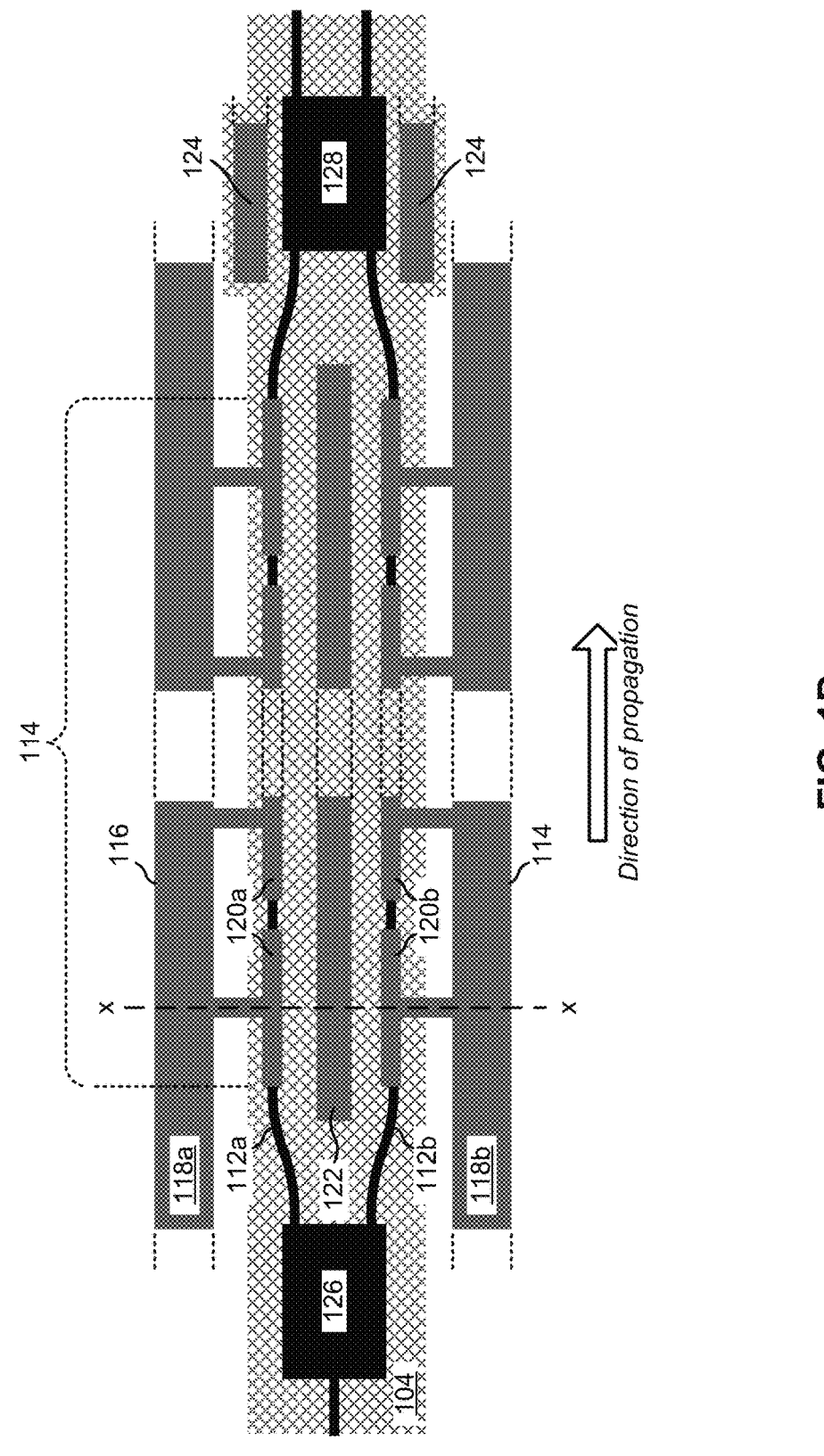

FIGS. 1A-1B are diagrams of an example implementation of a semiconductor-based electro-optic modulator 100 including a conductive strap (herein referred to as modulator 100). FIG. 1A is a diagram of an example cross section of the modulator 100 at the dashed line labeled "x-x" in the example plan view shown in FIG. 1B.

As shown, the modulator 100 includes a substrate 102. The substrate 102 is a supporting material upon which, or within which, one or more layers or features of the modulator 100 are grown or fabricated. In some implementations, the substrate 102 comprises a semi-insulating type of material. A semi-insulating substrate is a type of semiconductor substrate that has been heavily doped with, for example, chromium or iron to act as traps for electrons and holes, which makes the semiconductor substrate "semi-insulating." The modulator 100 including the conductive strap 122 may in practice be made on a substrate 102 comprising semi-insulating InP, semi-insulating gallium arsenide (GaAs), or another semi-insulating type III-V semiconductor material so as to reduce loss (e.g., because the RF waveguide 116 needs to be on an insulating substrate to keep loss low). This is why extracting the current along the conductive strap 122 is needed—the current cannot be extracted through the (semi-insulating) substrate 102. Therefore, in practice the substrate 102 may be a semi-insulating III-V semiconductor substrate that corresponds to a III-V material of the modulator 100 itself. Thus, the modulator 100 may in some implementations be referred to as a III-V semiconductor modulator.

As further shown, the modulator 100 includes a first doped layer 104, an undoped layer 106, a second layer 108, and a dielectric layer 110. The first doped layer 104 comprises a doped semiconductor material. In some implementations, the second layer 108 comprises an oppositely doped semiconductor material. That is, in some implementations, the second layer 108 may be a second doped layer, with the doping of the second layer 108 being opposite that of the first doped layer 104. Alternatively, the second layer 108 may in some implementations comprise a material that has the same type of doping as the first doped layer 104. In one example, the first doped layer 104 and the second layer 108 may be n-doped layers that are used to form an n-p-i-n diode in which the p-type material is minimized. Alternatively, the second layer 108 may in some implementations comprise a material that is not intentionally doped. As one example, the second layer 108 in a GaAs travelling-wave modulator may not have any doping, and an RF signal can be applied using a Schottky (e.g., metal-to-undoped semiconductor) contact. In some implementations, the undoped layer 106 comprises an intrinsic (i.e., undoped) semiconductor material.

A first region of the first doped layer 104, a first region of the undoped layer 106, a first region of the second layer 108, and first portions of the dielectric layer 110 (e.g., portions of the dielectric layer 110 on sidewalls of the first regions of the first doped layer 104, the undoped layer 106, and the second layer 108) form a first rib structure 112a, as indicated by the left dotted rectangle in FIG. 1A. The first rib structure 112a defines a first optical waveguide of the modulator 100. Similarly, a second region of the first doped layer 104, a second region of the undoped layer 106, a second region of the second layer 108, and second portions of the dielectric layer 110 (e.g., portions of the dielectric layer 110 on sidewalls of the second regions of the first doped layer 104, the undoped layer 106, and the second layer 108) form a second rib structure 112b, as indicated by the right dotted rectangle in FIG. 1A. The second rib structure 112b defines a second optical waveguide of the modulator 100. In some implementations, the first rib structure 112a and the second rib structure 112b extend along a modulation region 114 of the modulator 100, as indicated in FIG. 1B. The modulation region 114 is a region of the modulator 100 in which an RF signal can be applied to the first and second optical waveguides of the modulator 100 in association with modulating an input optical signal (e.g., continuous wave light that is to be modulated as the continuous wave light passes through the modulator 100), as described below. In one example, the first doped layer 104 is an n-doped layer and the second layer 108 is a p-doped layer. In such an implementation, the regions of the first doped layer 104, the undoped layer 106, the second layer 108, and the portions of the dielectric layer 110 form rib structures 112a and 112b that comprise p-i-n junctions along their respective lengths in the modulation region 114. As another example, the first doped layer 104 may in some implementations be a p-doped layer and the second layer 108 may be an n-doped layer. In such an implementation, the regions of the first doped layer 104, the undoped layer 106, the second layer 108, and the portions of the dielectric layer 110 form rib structures 112a and 112b that comprise n-i-p junctions along their respective lengths in the modulation region 114. As another example, the first doped layer 104 is an n-doped layer and the second layer 108 is an n-doped layer. In such an implementation, the regions of the first doped layer 104, the undoped layer 106, the second layer 108, a minimal amount of p-type material between the undoped layer 106 and the second layer 108, and the portions of the dielectric layer 110 form rib structures 112a and 112b that comprise n-p-i-n junctions along their respective lengths in the modulation region 114.

As further shown, the electro-optic modulator 100 includes an RF waveguide 116 that comprises a first track 118a and a second track 118b. The first track 118a is electrically connected (e.g., by a first set of air bridges) to a first set of RF electrode segments 120a that is over the first rib structure 112a (i.e., the first optical waveguide). The second track 118b is electrically connected (e.g., by a second set of air bridges) to a second set of RF electrode segments 120b that is over the second rib structure 112b (i.e., the second optical waveguide). As shown in FIG. 1B, a given set of RF electrode segments 120 may include one or more modulation segments (e.g., at least two separate RF electrode segments). In some implementations, as illustrated in FIGS. 1A-1B, the RF waveguide 116 may take the form of an RF coplanar stripline (CPS) waveguide. Notably, the RF waveguide 116 illustrated in FIGS. 1A and 1B is provided as an example, and other types of RF waveguides may be used. For example, the RF waveguide 116 may in some implementations comprise a coplanar waveguide (CPW) that includes an additional conductive element (e.g., a ground conductor). As another example, the tracks 118 and/or the sets of RF electrode segments 120 of the RF waveguide 116 may be positioned differently than shown in FIGS. 1A and 1B. For example, the sets of RF electrode segments 120 may be arranged on the substrate 102 or on the dielectric layer 110 on the substrate 102 (e.g., rather than over the rib structures 112).

As further shown, the electro-optic modulator 100 includes a conductive strap 122 between the first rib structure 112a and the second rib structure 112b. In some implementations, the conductive strap 122 is ohmically contacted with a region of the first doped layer 104 (e.g., a region of the first doped layer 104 between the first rib structure 112a and the second rib structure 112b). An ohmic contact is a metal-semiconductor contact in which current is directly proportional to voltage, defined by a fixed resistance. Notably, while the conductive strap 122 described herein may in practice be ohmically contacted to the region of the first doped layer 104, as described herein, another type of contact may be used. For example, the contact of the conductive strap 122 and the region of the first doped layer 104 may be a "leaky" Schottky diode contact, which would still enable the photocurrent to be extracted from the modulator 100. As shown in FIG. 1A, the conductive strap 122 contacts the first doped layer 104 through an opening 1100 in the dielectric layer 110. In some implementations, the conductive strap 122 comprises an ohmic contact layer 122oh that forms an ohmic interface, and a capping layer 122c. In some implementations, the ohmic contact layer 122oh of the conductive strap 122 may comprise, for example, nickel germanium gold (NiGeAu), palladium germanium gold (PdGeAu), or another type of ohmic contact material. In some implementations, the capping layer 122c of the conductive strap 122 may comprise, for example, a titanium/platinum/gold (Ti/Pt/Au) layer or another type of conductive material. Notably, in the modulator 100, the conductive strap 122 is not directly connected to a set of bias electrodes 124 (see FIG. 1B).

In some implementations, as illustrated in FIG. 1B, a length of the conductive strap 122 is greater than an overall length of the first set of RF electrode segments 120a and the second set of RF electrode segments 120b. Thus, in some implementations, a given end of the conductive strap 122 extends beyond an end of an overall length of the first and second sets of RF electrode segments 120. Alternatively, the length of the conductive strap 122 may in some implementations match (e.g., be equal to, within a tolerance) the overall length of the first set of RF electrode segments 120a and the second set of RF electrode segments 120b. Thus, in some implementations, a given end of the conductive strap 122 extends to an end of the overall length of the first and second sets of RF electrode segments 120. Alternatively, the length of the conductive strap 122 may in some implementations be less than the overall length of the first set of RF electrode segments 120a and the second set of RF electrode segments 120b. Thus, in some implementations, a given end of the conductive strap 122 does not extend beyond an end of the overall length of the first and second sets of RF electrode segments 120. In some implementations, as illustrated in FIG. 1B, the conductive strap 122 comprises a single conductive segment. Alternatively, the conductive strap 122 in some implementations may comprise at least two conductive segments (e.g., such that the conductive strap 122 comprises at least two separate segments). In some implementations, the region of the first doped layer 104 with which the conductive strap 122 is ohmically contacted is below the first and second regions of the first doped layer 104 that are included in the first and second rib structures 112. Additionally, the conductive strap is in some implementations below the first and second regions of the undoped layer 106 that are included in the first and second rib structures. In some implementations, the conductive strap 122 may be in another position relative to the regions of the rib structures 112 (e.g., so long as the conductive strap 122 is in direct contact with the first doped layer 104).

As further shown, the modulator 100 includes a set of bias electrodes 124. The set of bias electrodes 124 comprises a set of electrodes associated with applying a bias voltage that enables operation of the modulator 100. In operation, the diodes formed by the optical waveguides should be reverse biased, meaning that the set of bias electrodes 124 should have a positive voltage applied relative to a voltage applied to contacts of the sets of electrode segments 120. The photocurrent is generated by light travelling through regions of the undoped layer 106 of the rib structures 112 (i.e., the "i" region) that define the optical waveguides. This photocurrent needs to be extracted through the external circuit that connects the set of bias electrodes 124 and the tracks 118 of the RF waveguide 116. In some implementations, the set of bias electrodes 124 may be positive relative to the tracks 118 of the RF waveguide 116 (e.g., for a modulator 100 in which the first doped layer 104 is an n-type layer and the second doped layer 108 is a p-type layer). In some implementations, the set of bias electrodes 124 provides an external bias connection for the modulator 100. In some implementations, the conductive strap 122 serves to reduce resistance between the set of bias electrodes 124 and a third region of the first doped layer 104 between the first rib structure 112$a$ and the second rib structure 112$b$ (i.e., the region of the first doped layer 104 with which the conductive strap is ohmically contacted), as described below.

As further shown, the modulator 100 includes an optical splitter 126 to split an input optical signal (e.g., continuous wave light that is to be modulated as the continuous wave light passes through the modulator 100) to form a first optical signal that is to propagate in the first optical waveguide defined by the first rib structure 112$a$ and a second optical signal that is to propagate in the second optical waveguide defined by the second rib structure 112$b$. Here, the first optical signal is a first portion of the continuous wave light that is to be modulated as the first portion of the continuous wave light passes through the first optical waveguide of the modulator 100, and the second optical signal is a second portion of the continuous wave light that is to be modulated as the second portion of the continuous wave light passes through the second optical waveguide of the modulator 100. As further shown, the modulator 100 may include an optical combiner 128 to combine an output of the first rib structure 112$a$ (e.g., after application of a first RF signal during propagation of the first optical signal through the modulation region 114) and an output of the second rib structure 112$b$ (e.g., after application of a second RF signal during propagation of the second optical signal through the modulation region 114) to form one or more output optical signals. In practice, the first RF signal and the second RF signal may, in effect, be "two halves of the same RF signal." The tracks 118$a$ and 118$b$ are defined as the (single) RF waveguide 116 because that an RF waveguide needs two tracks—a positive track and a negative track (as shown in the modulator 100) or, alternatively, one signal line and one ground line. Thus, in some implementations, the first RF signal and the second RF signal may be positive and negative versions of one another.

In operation of the modulator 100, an input optical signal is split by the optical splitter 126 such that a first optical signal propagates in the first optical waveguide defined by the first rib structure 112$a$ in a direction of propagation (e.g., from left to right in FIG. 1B) and such that a second optical signal propagates in the second optical waveguide defined by the second rib structure 112$b$ in the direction of propagation. Here, a given optical signal travels along the rib structure 112 in a region of the undoped layer 106 of the rib structure 112 (e.g., in the "i" region). A junction formed by a given rib structure 112 is reverse biased and, therefore, the doping of the first doped layer 104 and the doping of the second layer 108 enable an electric field to be applied across the region of the undoped layer 106 in which a given optical signal travels. A refractive index of the region of the undoped layer 106 in the rib structure 112 is dependent on the electric field, meaning that a phase of the optical signal propagating in the region of the undoped layer 106 is dependent on the electric field. Thus, the RF waveguide 116 (e.g., through the tracks 118 and the sets of electrode segments 120) can be used to apply an RF signal to the optical waveguides defined by the rib structures 112 so as to modulate the phase of the optical signals propagating therein. Here, the RF signal is applied in the same direction as that in which the optical signals propagate (e.g., in the direction of propagation) and has a velocity that matches that of the optical signals (e.g., such that the modulator 100 is a velocity matched travelling-wave MZ modulator). The RF signal can be applied such that a phase shift in one optical waveguide guide (e.g., the first optical waveguide defined by the first rib structure 112$a$) is positive while a phase shift in the other optical waveguide (e.g., the second optical waveguide defined by the second rib structure 112$b$) is negative (e.g., relative to when the applied RF signal is zero). This causes constructive and destructive interference of the optical signals in the optical combiner 128, which modulates the intensity of an output optical signal of the modulator 100.

As noted above, photocurrent is generated in the modulation region 114 due to absorption of light in the first and second optical waveguides. In the modulator 100, the conductive strap 122 is in ohmic contact with a third region of the first doped layer 104 (e.g., a region between the first rib structure 112$a$ and the second rib structure 112$b$), as noted above. The ohmic contact of the conductive strap 122 with the third region of the first doped layer 104 enables the generated photocurrent, flowing through the first doped layer 104, to be extracted from the modulator 100. For example, the conductive strap 122 has a lower resistance than the first doped layer 104 and, therefore, provides a comparatively lower resistance conductive path for the photocurrent (e.g., as compared to a conductive path provided by the first doped layer 104). Therefore, a longitudinal sheet resistance of the conductive path to the set of bias electrodes 124 is reduced. As a result, a de-biasing effect is reduced or eliminated, meaning that all portions of the modulation region 114 are subject to substantially the same bias conditions, irrespective of photocurrent levels. This results in a switching voltage of the modulator 100 being reduced (e.g., at a given pre-modulator SOA current level) and, furthermore, reduces or eliminates dependence of the switching voltage on optical power. In this way, electro-optic efficiency is improved, while setup complexity is reduced (e.g., since changing a pre-modulator SOA current level does not impact bias conditions of the modulator 100).

As indicated above, FIGS. 1A-1B are provided as an example. Other examples may differ from what is described with regard to FIGS. 1A-1B. The number and arrangement of layers and elements shown in FIGS. 1A-1B are provided as an example. In practice, there may be additional layers or elements, fewer layers or elements, different layers or elements, or differently arranged layers or elements than those shown in FIGS. 1A-1B. Furthermore, two or more layers or elements shown in FIGS. 1A-1B may be implemented within a single layer or element, or a single layer or element shown in FIGS. 1A-1B may be implemented as multiple, distributed layers or elements.

Figures 2A, 2B:
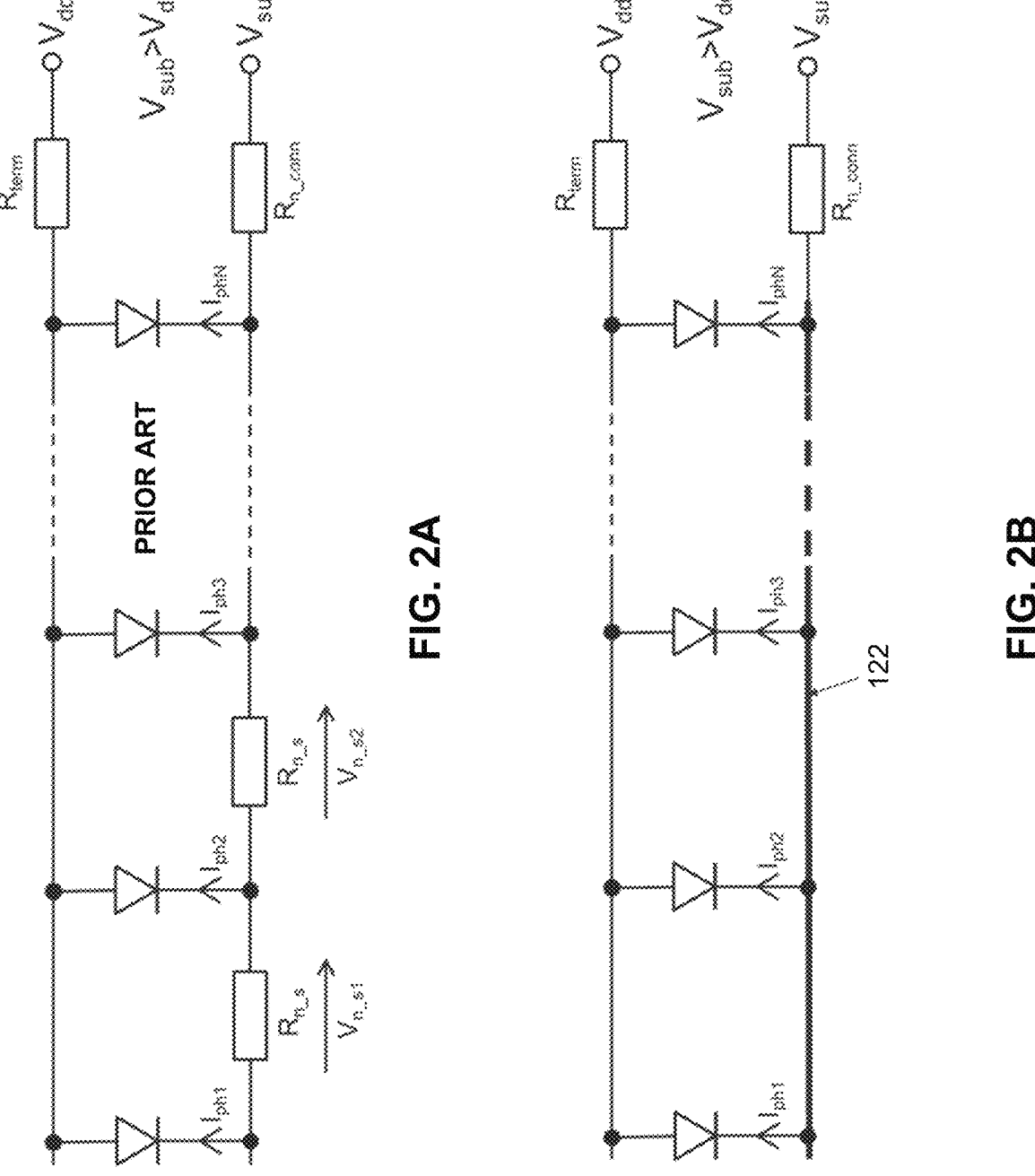
FIGS. 2A-2B are diagrams illustrating a difference in an equivalent circuit of a conventional semiconductor-based modulator and an equivalent circuit of the semiconductor-based modulator including the conductive strap described herein.

FIGS. 2A-2B are diagrams illustrating a difference in an equivalent circuit of a conventional semiconductor-based modulator and an equivalent circuit of the modulator 100 including the conductive strap 122 described herein.

As described above, when semiconductor-based electro-optic modulator is DC-biased during operation, some light is absorbed in the optical waveguides, which generates photocurrent. FIG. 2A is an example equivalent circuit of a conventional semiconductor-based electro-optic modulator that does not include the conductive strap 122. As shown, in the absence of the conductive strap 122, a longitudinal sheet resistance of a region of a doped layer between each modulation segment $R_{n\_s}$ is significant and, therefore, the photocurrent $I^{ph}$ induced in each segment induces a voltage drop $V_{n\_s}$ across this resistance, thereby reducing the bias applied to parts of the modulation region of the conventional semiconductor-based electro-optic modulator. The magnitude of the bias reduction increases as distance from the $V_{sub}$ bias electrode increases. As described herein, the bias reduction causes a reduction in electro-optic efficiency in the affected parts of the conventional semiconductor-based electro-optic modulator, which increases the switching voltage $V_{pi}$. In particular, since $I_{ph}$ is optical power dependent, the $V_{pi}$ increase will depend on the optical input power and the pre-modulator SOA current.

FIG. 2B is an example equivalent circuit of the modulator 100 including the conductive strap 122. As illustrated in FIG. 2B, the longitudinal resistance becomes relatively negligible due to the ohmic contact of the conductive strap 122 with the first doped layer 104. Thus, the entire modulation region 114 is subject to substantially the same bias conditions, irrespective of photocurrent generated in the modulator 100. Notably, the conductive strap 122 is not directly connected to the bias electrode in order to provide the reduction or elimination of the longitudinal sheet resistance.

As indicated above, FIGS. 2A-2B are provided as examples. Other examples may differ from what is described with regard to FIGS. 2A-2B.

Figures 3A, 3B:
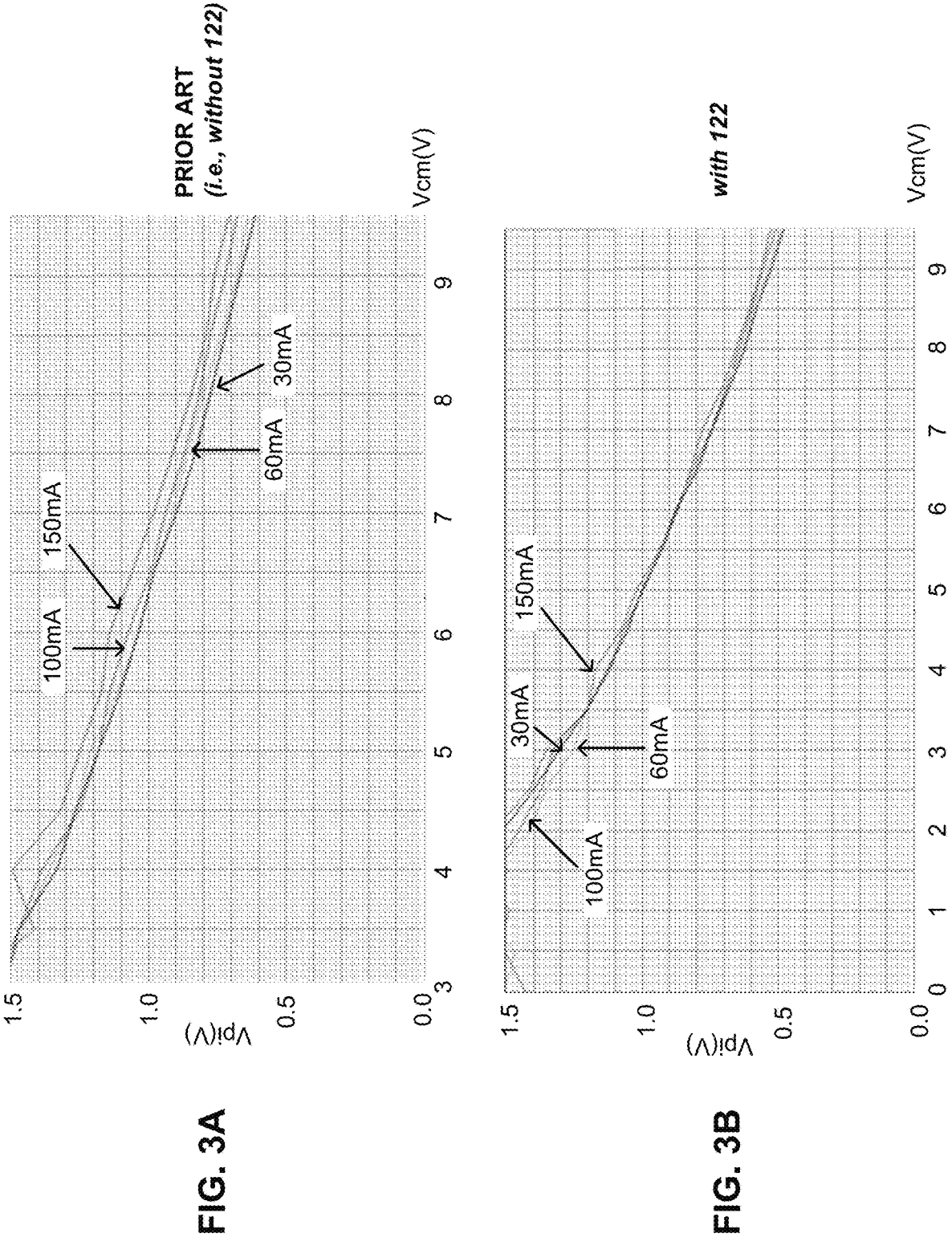
FIGS. 3A-3B are diagrams illustrating example measurement results showing an improvement in performance of the semiconductor-based modulator with the conductive strap described herein as compared to a conventional semiconductor-based electro-optic modulator.

FIGS. 3A-3B are diagrams illustrating example measurement results showing an improvement in performance of the modulator 100 including the conductive strap 122 described herein as compared to a conventional semiconductor-based electro-optic modulator. FIGS. 3A and 3B show switching voltage ($V_{pi}$) plotted against bias voltage ($V_{cm}$) for various pre-semiconductor SOA current levels (30 milliamps (mA), 60 mA, 100 mA, and 150 mA). FIG. 3A illustrates performance of a conventional semiconductor-based electro-optic modulator (that does not include the conductive strap 122), while FIG. 3B illustrates performance of the modulator 100 including the conductive strap 122.

As can be seen by comparison of FIGS. 3A and 3B, the optical power dependence of the switching voltage $V_{pi}$ that is present in the conventional semiconductor-based electro-optic modulator is reduced or, in some ranges of bias voltage $V_{cm}$, is nearly eliminated in the modulator 100 that includes the conductive strap 122. For example, in the conventional semiconductor-based electro-optic modulator, at a bias voltage $V_{cm}$ of 5.5 volts (V), the switching voltage $V_{pi}$ increases as the pre-modulator SOA current increases (i.e., as the input optical power increases). However, in the modulator 100 including the conductive strap 122, at a bias voltage $V_{cm}$ of 5.5 V, the switching voltage $V_{pi}$ is reduced for a given pre-modulator SOA current level and, furthermore, change in the switching voltage $V_{pi}$ is negligible as the pre-modulator SOA current increases. This reduction in the switching voltage $V_{pi}$ and reduction of the dependence of the switching voltage $V_{pi}$ on the optical input power is provided by the reduction or elimination of the de-biasing effect such that bias conditions are substantially the same across the modulation region 114, irrespective of photocurrent levels.

As indicated above, FIGS. 3A-3B are provided as examples. Other examples may differ from what is described with regard to FIGS. 3A-3B.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

When a component or one or more components (e.g., a laser emitter or one or more laser emitters) is described or claimed (within a single claim or across multiple claims) as performing multiple operations or being configured to perform multiple operations, this language is intended to broadly cover a variety of architectures and environments. For example, unless explicitly claimed otherwise (e.g., via the use of "first component" and "second component" or other language that differentiates components in the claims), this language is intended to cover a single component performing or being configured to perform all of the operations, a group of components collectively performing or being configured to perform all of the operations, a first component performing or being configured to perform a first operation and a second component performing or being configured to perform a second operation, or any combination of components performing or being configured to perform the operations. For example, when a claim has the form "one or more components configured to: perform X; perform Y; and perform Z," that claim should be interpreted to mean "one or more components configured to perform X; one or more (possibly different) components configured to perform Y; and one or more (also possibly different) components configured to perform Z."

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. An electro-optic modulator, comprising:
a radio frequency (RF) modulation region, including:
a first optical waveguide to propagate a first optical signal travelling in a direction of propagation;
a second optical waveguide to propagate a second optical signal travelling in the direction of propagation;
a first set of electrode segments to apply a first RF signal to the first optical waveguide in association with modulating the first optical signal, the first RF signal being provided by a first track of an RF waveguide and travelling in the direction of propagation;
a second set of electrode segments to apply a second RF signal to the second optical waveguide in association with modulating the second optical signal, the second RF signal being provided by a second track of the RF waveguide and travelling in the direction of propagation; and
a conductive strap to enable photocurrent generated in the first optical waveguide and the second optical waveguide and flowing through a doped layer below the first optical waveguide and the second optical waveguide to be extracted from the electro- optic modulator, the conductive strap being between the first optical waveguide and the second optical waveguide and being ohmically contacted with the doped layer,
wherein the conductive strap provides a lower resistance conductive path for the photocurrent than a conductive path provided by the doped layer.

2. The electro-optic modulator of claim 1, wherein the conductive strap is not directly connected to an external bias connection of the electro-optic modulator.

3. The electro-optic modulator of claim 1, wherein the conductive strap comprises an ohmic contact layer and a capping layer.

4. The electro-optic modulator of claim 1, wherein a length of the conductive strap is greater than or equal to an overall length of the first set of electrode segments and an overall length of the second set of electrode segments.

5. The electro-optic modulator of claim 1, wherein an end of the conductive strap extends beyond an end of the first set of electrode segments and an end of the second set of electrode segments.

6. The electro-optic modulator of claim 1, wherein the conductive strap comprises a single conductive segment.

7. The electro-optic modulator of claim 1, wherein the conductive strap comprises at least two conductive segments.

8. The electro-optic modulator of claim 1, wherein the conductive strap contacts the doped layer through an opening in a dielectric layer that is over the doped layer.

9. The electro-optic modulator of claim 1, wherein the electro-optic modulator is a III-V semiconductor modulator.

10. An electro-optic modulator, comprising:
a substrate;
a first doped layer over the substrate;
an undoped layer over the first doped layer;
a second layer over the undoped layer,
wherein a first region of the first doped layer, a first region of the undoped layer, a first region of the second layer, and first portions of a dielectric layer form a first rib structure, and
wherein a second region of the first doped layer, a second region of the undoped layer, a second region of the second layer, and second portions of a dielectric layer form a second rib structure;
a first set of electrode segments over the first rib structure;
a second set of electrode segments over the second rib structure;
a first track of a radio frequency (RF) waveguide electrically connected to the first set of electrode segments;
a second track of the RF waveguide electrically connected to the second set of electrode segments; and
a conductive strap ohmically contacted with a third region of the first doped layer, the third region of the first doped layer being between the first region of the first doped layer and the second region of the first doped layer,
wherein the conductive strap provides a lower resistance conductive path for photocurrent than a conductive path provided by the first doped layer.

11. The electro-optic modulator of claim 10, wherein the conductive strap is to enable photocurrent generated in the first rib structure and the second rib structure and flowing through the first doped layer to be extracted from the electro-optic modulator.

12. The electro-optic modulator of claim 10, wherein the conductive strap is not directly connected to an external bias connection of the electro-optic modulator.

13. The electro-optic modulator of claim 10, wherein the conductive strap comprises an ohmic contact layer and a capping layer over the ohmic contact layer.

14. The electro-optic modulator of claim 10, wherein the conductive strap comprises a single conductive segment.

15. The electro-optic modulator of claim 10, wherein the conductive strap contacts the first doped layer through an opening in a dielectric layer that is over the first doped layer.

16. The electro-optic modulator of claim 10, wherein the electro-optic modulator is a III-V semiconductor modulator.

17. A semiconductor-based modulator, comprising:
a radio frequency (RF) modulation region, including:
a first optical waveguide to propagate a first optical signal travelling in a direction of propagation;
a second optical waveguide to propagate a second optical signal travelling in the direction of propagation;
an RF waveguide to apply a first RF signal to the first optical waveguide and to apply a second RF signal to the second optical waveguide, the first RF signal and the second RF signal travelling in the direction of propagation; and
a conductive strap to reduce resistance on a conductive path between an external bias connection of the semiconductor-based modulator and a doped region below the first optical waveguide and the second optical waveguide to enable photocurrent flowing through the doped region to be extracted from the semiconductor-based modulator,
wherein the conductive strap provides a lower resistance conductive path for the photocurrent than a conductive path provided by the doped region.

18. The semiconductor-based modulator of claim 17, wherein, the conductive strap is ohmically contacted with the doped region.

19. The semiconductor-based modulator of claim 17, wherein the conductive strap is not directly connected to the external bias connection.

20. The semiconductor-based modulator of claim 17, wherein the conductive strap contacts the doped region through an opening in a dielectric layer that is over the doped region.

* * * * *